July 5, 1960 W. F. NEWBOLD 2,944,218

ELECTRICAL SIGNAL CONVERSION APPARATUS

Filed Aug. 30, 1957

*INVENTOR.*
WILLIAM F. NEWBOLD
*BY* Arthur H. Swanson
ATTORNEY.

2,944,218
Patented July 5, 1960

2,944,218

ELECTRICAL SIGNAL CONVERSION APPARATUS

William F. Newbold, Ambler, Pa., assignor to Minneapolis-Honeywell Regulator Company, Minneapolis, Minn., a corporation of Delaware Filed Aug. 30, 1957, Ser. No. 681,284
5 Claims. (Cl. 328—26)

The present invention pertains to an apparatus for converting an alternating current signal to a direct current signal. More specifically, the present invention is concerned with an alternating current to direct current conversion apparatus of the type employing diode rectifiers and which is characterized by stability and linearity of operation.

Theoretically, an alternating current signal can be converted to a proportional direct current signal by the use of diode rectifiers. In theory, the diode presents zero resistance in one direction and an infinite resistance in the opposite direction. However, as may be expected of all physical devices, the forward resistance of a diode is not zero. While the forward resistance of recently developed silicon diodes is a relatively stable value, the variation from diode to diode and the variation in the resistance of a single diode with temperature and time makes the forward resistance of a diode a finite and variable factor. Secondly, a diode does not have a low resistance in the forward direction until a voltage measured in hundreds of milivolts has been exceeded. Thirdly, a diode does not exhibit infinite resistance in the reverse direction. This factor, however, can be negligible in circuits employing silicon diodes which have an extremely high reverse to forward resistance ratio.

Accordingly, it is a specific object of the present invention to provide an apparatus for converting an A.C. signal to a D.C. signal which is substantially independent of the characteristics of the diode rectifiers employed.

Another specific object of the present invention is to utilize negative feedback to minimize the effect of diode characteristics upon their rectification properties.

In prior art devices, negative voltage feedback has been employed to linearize diode characteristics. This type of feedback has the limitation that the accuracy of the system does not increase with input signals of increased magnitude. In fact, input signals of sufficient magnitude to saturate the amplifier employed must be attenuated.

It is therefore a specific object of the present invention to employ negative current feedback and thus to provide an A.C. to D.C. conversion system in which the accuracy of the system can be increased with input signals of increased magnitudes.

The various objects of the present invention are achieved in an apparatus in which a diode rectifier bridge is connected in a current feedback path of an amplifier. The direct current output of the circuit is taken from the diode rectifier bridge in the feedback circuit.

Figure 1:
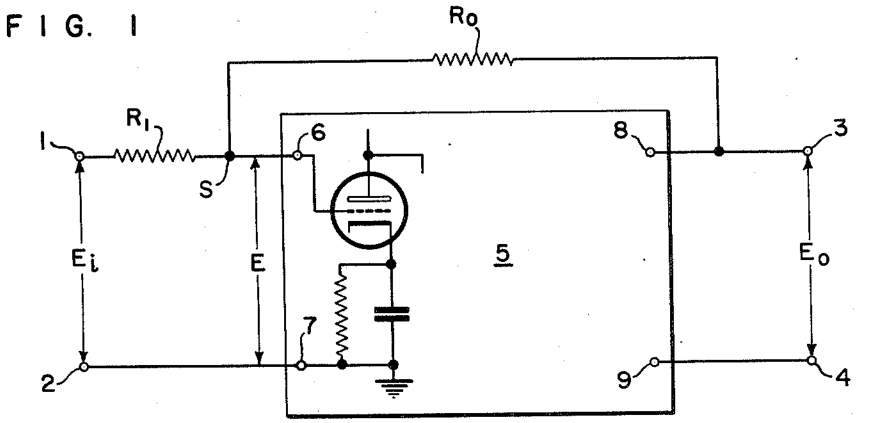
Figure 2:
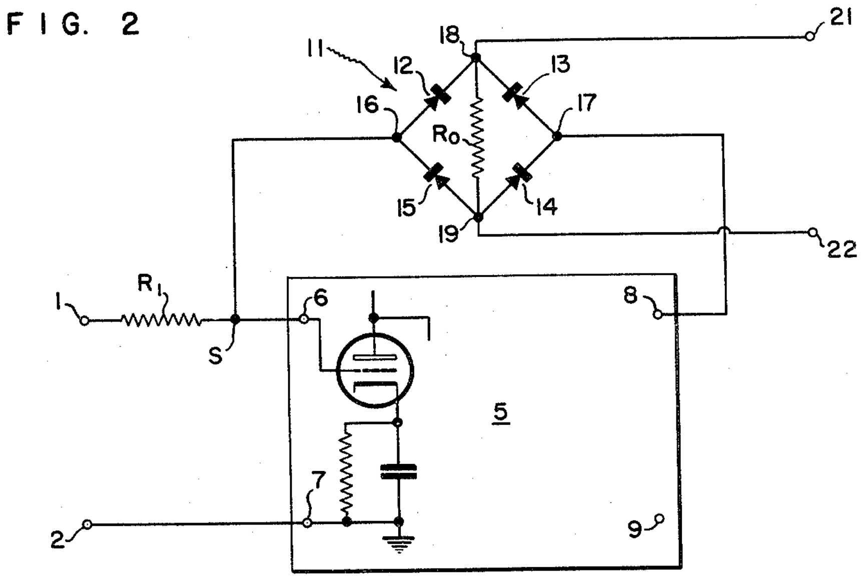

A better understanding of the present invention may be had from the following description read with reference to the accompanying drawings of which:

Fig. 1 is a circuit illustrating the principle of operation employed in the present invention; and Fig. 2 is a diagram of a preferred embodiment of the present invention.

Considering first the circuit of Fig. 1, there is shown a diagrammatic circuit of an amplifier having a negative current feedback loop. The circuit has a pair of input terminals 1 and 2 and a pair of output terminals 3 and 4. The numeral 5 designates an amplifier having a high forward gain over the range of operating frequencies. The amplifier 5 has a pair of input terminals 6 and 7 and a pair of output terminals 8 and 9. The circuit input terminal 1 is connected to the amplifier input terminal 6 by means of a resistor $R_1$. As shown, the circuit input terminal 2 is connected directly to the amplifier input terminal 7 and the circuit output terminals 3 and 4 are connected directly to the amplifier output terminals 8 and 9, respectively. In addition, the amplifier output terminal 8 is connected by means of a resistor $R_0$ to a summing point S between the input terminal 6 of the amplifier 5 and the resistor $R_1$.

Considering the operation of the circuit shown in Fig. 1, an input voltage $E_i$ impressed across the circuit input terminals 1 and 2 will cause an output voltage $E_0$ to appear across the circuit output terminals 3 and 4. The resistor $R_0$ is a feedback resistor connecting this output voltage to the summing point S. If the voltage across the input terminals 6 and 7 of the amplifier is designated as E, then $$E_o = AE \text{ or } E = \frac{E_o}{A} \quad (1)$$

where $A$=the gain of the amplifier. According to Kirchhoff's first law, the sum of all currents flowing into the summing point S must be zero. Since with any high gain high input impedance amplifier having output voltage negligible current will flow into the input, we can neglect any current which flows from the summing point S into the amplifier 5. If the current flowing into the amplifier 5 is neglected, the "nodal" equation expressing this fact is:

$$\left(\frac{E_o}{A} - E_o\right)\frac{1}{R_0} + \left(\frac{E_o}{A} - E_i\right)\frac{1}{R_1} = 0 \quad (2)$$

where:

$\left(\frac{E_o}{A} - E_o\right)\frac{1}{R_0}$ = the current flowing in the resistor $R_0$ $\left(\frac{E_o}{A} - E_i\right)\frac{1}{R_1}$ = the current flowing in the resistor $R_1$ Since the gain of the amplifier 5 is extremely high, by a good approximation, the above equation becomes $$-\frac{E_o}{R_0} - \frac{E_i}{R_1} = 0 \quad (3)$$

From this equation, it can be seen that current flow through the resistor $R_0$ is equal to the input voltage divided by the resistor $R_1$. Since extremely accurate and stable high gain high input impedance amplifiers are commercially available, this circuit provides a means for deriving a current which is proportional to a voltage.

From Equation 3 it can also be seen that the close loop gain of the system is proportional to $$\frac{R_0}{R_1}$$

Thus, if $R_1$ is increased to compensate for increased input signals, the system has more feedback and thus more linearity and accuracy.

Referring now to Fig. 2, there is shown a circuit diagram of a preferred embodiment of the present invention which utilizes the principles discussed hereinbefore to provide accurate conversion of alternating current signals into direct current signals. Similar reference characters have been employed to designate the components shown in the circuit of Fig. 2 which have been described with reference to the circuit of Fig. 1. As shown, a diode rectifier bridge 11, comprising the diodes 12, 13, 14, and 15, has been connected in the feedback loop of the amplifier. Thus, one input terminal 16 of the diode rectifier bridge 11 is connected to the summing point S and the other input terminal 17 of the diode bridge rectifier 11 is connected to the output terminal 8 of the amplifier 5. The feedback resistor $R_0$ is connected across the output terminals 18 and 19 of the diode rectifier bridge 11. As shown, the output terminals 18 and 19 of the diode rectifier bridge 11 are connected to the circuit output terminals 21 and 22 respectively.

In considering the operation of the circuit shown in Fig. 2, it should be noted that there are two paths which the current flowing through $R_0$ may take depending upon the polarity of the input voltage. If the input voltage is such that the input terminal 1 is positive with respect to the input terminal 2, then the current flowing from the summing point S flows through the diode 12, the resistor $R_0$, and the diode 14 to the output terminal 8 of the amplifier 5. If the input voltage is of the opposite polarity, the current flow will be through the diode 13, the resistor $R_0$, and the diode 15 to the summing point S. It should be noted, that the polarity of the current flow through the resistor $R_0$ remains the same regardless of the polarity of the input voltage applied across the circuit input terminals 1 and 2.

As stated hereinbefore, the current flow through the feedback resistor $R_0$ is proportional to the input voltage. When the input voltage is such that the input terminal 1 is positive with respect to the terminal 2, the resistance in series with the resistor $R_0$ is the sum of the resistances of the diodes 12 and 14. When the polarity of the input voltage is such that the input terminal 2 is positive with respect to the terminal 1, the resistance in series with the resistor $R_0$ is the sum of the resistances of the diodes 13 and 15. As previously noted, the forward resistance of a diode is not stable and further there is a threshold voltage which must be exceeded before a diode will exhibit a low forward resistance. In the present invention, however, these factors are insignificant since the current flowing through the resistor $R_0$ is determined solely by the input voltage and the resistor $R_1$ and is not effected by the non-linearities of the diodes. The voltage across the resistor $R_0$, which is a direct current, is determined solely by the current through the resistor $R_0$ times its resistance. Thus, the present invention provides a rectifier circuit which is independent of the forward resistance characteristics of the diodes employed.

When current flows through the resistor $R_0$, a voltage is impressed across the back resistance of two of the diodes in the bridge 11. Any current which flows through the diodes in the reverse direction reduces the current flow through $R_0$ from that which is determined by the input voltage divided by the resistance of the resistor $R_1$. This constitutes an error. The magnitude of this error is determined by the leakage current which depends on the quality of diodes employed in the bridge 11. This error can be made negligible, however, by employing high quality silicon diodes which have extremely high reverse to forward resistance ratios.

From the foregoing, it is evident that the present invention provides a circuit which will develop across the circuit output terminals a full wave rectified voltage which is directly proportional to the alternating input voltage. Further, the present invention provides a circuit which is capable of obtaining a true average value of an A.C. signal. This is extremely important where the A.C. voltage in question is distorted and thus its peak value is not an accurate measure of its average value. Still further, if the input signal to the circuit is such that it will cause the amplifier to saturate, $R_1$ can be increased. This will increase the amount of feedback in the system increasing the linearity and stability of the system.

Having now described the present invention, that which is claimed as new and desired to secure by Letters Patent is:

1. An apparatus for converting an alternating current signal into a direct current signal comprising an amplifier having an input and an output, a diode rectifier bridge, and means connecting said rectifier bridge in a feedback loop around said amplifier, the alternating current signal being applied to the input of said amplifier through a series resistor and the direct current being taken across said rectifier bridge.

2. In combination, an amplifier having an input and an output, a first resistor connected to said amplifier input, a feedback loop connecting said amplifier output to said input, a diode rectifier bridge connected in said feedback loop, and a second resistor connected across said diode rectifier bridge, said combination producing across said second resistor a direct current signal proportional to an alternating current signal applied across said first resistor and said amplifier input.

3. An apparatus for converting an alternating current signal to a direct current signal comprising, in combination, a high gain amplifier having an input and an output, a first resistor connected to said amplifier input, said alternating current signal being applied across said resistor and said amplifier input, a feedback loop connecting said amplifier output to said amplifier input, a diode rectifier bridge having an input and an output, the input of said bridge being connected in said feedback loop, and a second resistor connected across the output of said bridge, said direct current signal being derived across said second resistor.

4. In combination, a pair of circuit input terminals and a pair of circuit output terminals, a high gain amplifier having a pair of input terminals and a pair of output terminals, a first resistor connecting one of said circuit input terminals to one of said amplifier input terminals, the other circuit input terminal being directly connected to the other of said amplifier input terminals, a feedback loop connecting one of said amplifier output terminals to said first mentioned amplifier input terminal, a diode rectifier bridge having a pair of input terminals and a pair of output terminals, the input terminals of said rectifier bridge being connected in said feedback loop, a second resistor connected across the output terminals of said rectifier bridge, and means connecting the output terminals of said rectifier bridge to said circuit output terminals, the combination being adapted to produce at said circuit output terminals a unidirectional signal directly proportional to an alternating current signal applied to said circuit input terminals.

5. In combination, an operational amplifier having an input, an output, and a feedback loop, four silicon diode rectifiers, said rectifiers being connected in a bridge circuit having an input and an output, the input of said bridge being connected in the feedback loop of said operational amplifier, a first resistor connected across the output of said bridge, and a second resistor connected to the input of said amplifier, the combination being adapted to produce across said first resistor a direct current signal directly proportional to an alternating current signal applied to said second resistor and the input of said operational amplifier.

References Cited in the file of this patent

UNITED STATES PATENTS

| | | |
|---|---|---|
| 1,903,542 | Barber | Apr. 11, 1933 |
| 2,213,099 | Adorjan | Aug. 27, 1940 |
| 2,315,442 | McRae | Mar. 30, 1943 |
| 2,645,765 | Bixby | July 14, 1953 |